(12) United States Patent
Kim

(10) Patent No.: US 12,249,975 B2
(45) Date of Patent: Mar. 11, 2025

(54) FILM BULK ACOUSTIC RESONATOR CHIP AND PACKAGE STRUCTURE WITH IMPROVED POWER TOLERANCE

(71) Applicant: WISOL CO., LTD., Osan-si (KR)

(72) Inventor: Young Hun Kim, Osan-si (KR)

(73) Assignee: WISOL CO., LTD., Osan-si (KR)

(*) Notice: Subject to any disclaimer, the term of this patent is extended or adjusted under 35 U.S.C. 154(b) by 1009 days.

(21) Appl. No.: 17/158,434

(22) Filed: Jan. 26, 2021

(65) Prior Publication Data

US 2022/0060176 A1  Feb. 24, 2022

(30) Foreign Application Priority Data

Aug. 24, 2020 (KR) .................. 10-2020-0106137

(51) Int. Cl.
*H03H 9/205* (2006.01)
*H03H 3/02* (2006.01)
*H03H 9/02* (2006.01)
*H03H 9/13* (2006.01)

(52) U.S. Cl.
CPC .............. *H03H 9/205* (2013.01); *H03H 3/02* (2013.01); *H03H 9/02015* (2013.01); *H03H 9/131* (2013.01); *H03H 2003/021* (2013.01)

(58) Field of Classification Search
CPC .......... H03H 3/02; H03H 9/131; H03H 9/205; H03H 9/02015; H03H 2003/021
USPC ........................................................ 310/334
See application file for complete search history.

(56) References Cited

U.S. PATENT DOCUMENTS

2020/0014365 A1* 1/2020 Nambu ................. H03H 9/725
2020/0228096 A1* 7/2020 Shen ....................... H03H 9/542

FOREIGN PATENT DOCUMENTS

| JP | 2007-116628 A | 5/2007 |
| JP | 2007-281846 A | 10/2007 |
| KR | 10-2004-0043055 A | 5/2004 |
| KR | 10-2017-0097366 A | 8/2017 |
| KR | 10-2018-0116407 A | 10/2018 |

(Continued)

OTHER PUBLICATIONS

KIPO Office Action, dated Oct. 26, 2022, for Korean Patent Application No. 10-2020-0106137 which corresponds to the above-identified U.S. application.

(Continued)

*Primary Examiner* — Emily P Pham
*Assistant Examiner* — Monica Mata
(74) *Attorney, Agent, or Firm* — LRK PATENT LAW FIRM

(57) ABSTRACT

A film bulk acoustic resonator (FBAR) chip and package structure with improved power tolerance includes: a first substrate having a plurality of FBARs each having a bottom electrode, a piezoelectric material, and a top electrode, and first bonding pads connected to the bottom electrodes or the top electrodes of the FBARs; and a second substrate having a plurality of vias passing therethrough, second bonding pads located on one end surface of the vias facing the first substrate, and external connection pads located on the other end surface of the vias which does not face the first substrate, wherein the first substrate and the second substrate are bonded by means of bonding of the first bonding pads and the second bonding pads.

18 Claims, 7 Drawing Sheets

(56) References Cited

FOREIGN PATENT DOCUMENTS

KR    10-2020-0000058 A    1/2020
WO      2013/121866 A1    5/2015

OTHER PUBLICATIONS

KIPO Notice of Allowance, dated Jul. 11, 2023, for Korean Patent Application No. 10-2020-0106137 which corresponds to the above-identified U.S. application.
KIPO Office Action, dated Jan. 30, 2023, for Korean Patent Application No. 10-2020-0106137 which corresponds to the above-identified U.S. application.

* cited by examiner

FILM BULK ACOUSTIC RESONATOR CHIP AND PACKAGE STRUCTURE WITH IMPROVED POWER TOLERANCE

CROSS-REFERENCE TO RELATED APPLICATION

The present application claims the benefit of Korean Patent Application No. 10-2020-0106137 filed in the Korean Intellectual Property Office on Aug. 24, 2020, the entire contents of which are incorporated herein by reference.

BACKGROUND OF THE INVENTION

1. Field of the Invention

The present invention relates to a film bulk acoustic resonator (hereinafter referred to as "FBAR") chip and package structure with improved power tolerance, and more particularly, to an FBAR chip and package structure that is capable of achieving more improved power tolerance than a conventional FBAR chip and package structure.

2. Description of Related Art

As a need for miniaturization and high-density stacking of a small electronic device like a smartphone is greatly increasing, recently, surface-mount technology for an electronic element like a semiconductor integrated circuit (IC) is drastically evolved.

Instead of chip unit packaging, wafer level packaging is introduced to remarkably decrease a packaging thickness, and a lamination substrate is adopted even in a printed circuit board to thus develop various materials, equipment and process technologies.

With the development of information and communication technology and the evolution of networks, further, an amount of information used or needed by people becomes rapidly huge, and accordingly, all kinds of electronic devices have to stack a substantially larger number of parts therein than before so as to provide various, new and high-end functions, so that they become more and more complicated and the electronic elements are located closer to one another.

In specific, current and future electronic devices have to be developed, while consistently satisfying both of miniaturization and high-end function implementation which are not compatible with each other.

Of course, such demand with respect to using a bandpass filter for smartphones is not an exception, and in a more complicated wireless environment using high frequencies like 5G, accordingly, a bulk acoustic wave (BAW) filter or duplexer has to achieve more improved power tolerance and miniaturization.

So as to ensure such improved power tolerance, generally, the number of BAW resonators is increased in a longitudinal direction of the filter. In this case, the sizes of the resonators are maximized to allow heat generated from the resonators to be easily dissipated, and the heat resistance of the resonators is totally decreased to improve the durability and reliability with respect to the power.

FIG. 8 is a sectional view showing a conventional FBAR package as one kind of BAW devices.

Referring to FIG. 8, the conventional FBAR chip and package structure is configured to locate an FBAR 20 on a silicon substrate 10 in such a manner as to be sealed with a second substrate 30 and a wafer level package (WLP).

As shown, the FBAR 20 includes a bottom electrode, a piezoelectric material, and a top electrode. Under the bottom electrode, an air cavity is formed to allow a bulk acoustic wave to be easily produced, and on the top electrode, a passivation layer is formed. The second substrate 30 of FIG. 8 may be a silicon substrate.

Further, the top and bottom electrodes of the FBAR 20 are connected to internal electrode pads 40, and the internal electrode pads 40 are connected to external connection pads 60 by means of vias 50 passing through the second substrate 30. The external connection pads 60 are connected to signal wiring or ground wiring. The internal electrode pads 40 may include bonding pads for bonding the wafer level package and the second substrate 30.

FIG. 9 is a schematic diagram showing a conventional filter structure in which a plurality of FBARs as shown in FIG. 8 are connected in series and parallel so as to improve power tolerance.

So as to improve the power tolerance of the FBARs in the conventional filter structure, as shown in FIG. 9, one FBAR in the existing structure is increased to two FBARs in some positions.

In the case where the number of FBARs is increased to enlarge thermal dissipation areas, as shown in FIG. 9, the power tolerance needed can be achieved, but the miniaturization of the device cannot be achieved at all.

Accordingly, there is a need for development of a new FBAR chip and package structure that can satisfy both of the power tolerance needed and the miniaturization of the device.

SUMMARY OF THE INVENTION

Accordingly, the present invention has been made in view of the above-mentioned problems occurring in the related art, and it is an object of the present invention to provide an FBAR chip and package structure that is capable of achieving more improved power tolerance than a conventional FBAR chip and package structure.

It is another object of the present invention to provide an FBAR chip and package structure that is capable of satisfying both of improved power tolerance and package miniaturization.

It is yet another object of the present invention to provide an FBAR chip and package structure that is capable of efficiently utilizing the existing FBAR chip structure in a manufacturing process.

It is still another object of the present invention to provide an FBAR chip and package structure that is capable of still utilizing the existing FBAR manufacturing procedure and equipment in a manufacturing process.

To accomplish the above-mentioned objects, according to one aspect of the present invention, there is provided a film bulk acoustic resonator (FBAR) chip and package structure with improved power tolerance, including: a first substrate having a plurality of FBARs each having a bottom electrode, a piezoelectric material, and a top electrode, and first bonding pads connected to the bottom electrodes or the top electrodes of the FBARs; and a second substrate having a plurality of vias passing therethrough, second bonding pads located on one end surface of the vias facing the first substrate, and external connection pads located on the other end surface of the vias which does not face the first substrate, wherein the first substrate and the second substrate are bonded by means of bonding of the first bonding pads and the second bonding pads, at least some of the bottom electrodes are connected to the first bonding pads through piezoelectric layer vias filled with a conductive material, and the vias on the second substrate include first vias connected to signal or ground wiring through the external connection pads and second vias with no connection to any signal or ground wiring.

According to the present invention, desirably, the first vias are filled with a conductive material, and the second vias are filled with a material having a higher thermal conductivity than the first vias.

According to the present invention, desirably, the first vias and the second vias are filled with the same material as each other or with different materials from each other.

According to the present invention, desirably, the first vias are connected to the piezoelectric layer vias.

According to the present invention, desirably, the diameters of the first vias and the second vias are different from each other, and the diameters of the second vias are larger than the diameters of the first vias.

According to the present invention, desirably, the sectional shapes of the first vias and the second vias are different from each other.

According to the present invention, desirably, the external connection pads are formed only on the first vias.

According to the present invention, desirably, if the external connection pads are formed on the second vias, the external connection pads are covered with passivation layers.

According to the present invention, desirably, at least two or more top electrodes of the FBARs are connected unitarily with one another by means of an electrode connecting part, and when viewed on top, the second vias are formed among the top or bottom electrodes connected unitarily with one another.

According to the present invention, desirably, the first substrate includes a heat sink groove formed between the two or more bottom electrodes with no connection with the first bonding pads in such a manner as to be filled with a thermal dissipation material.

To accomplish the above-mentioned objects, according to another aspect of the present invention, there is provided a film bulk acoustic resonator (FBAR) chip and package structure with improved power tolerance, including: a first substrate having a plurality of FBARs each having a bottom electrode, a piezoelectric material, and a top electrode, and first bonding pads connected to the bottom electrodes or the top electrodes of the FBARs; and a second substrate having a plurality of vias passing therethrough, second bonding pads located on one end surface of the vias facing the first substrate, and external connection pads located on the other end surface of the vias which does not face the first substrate, wherein the first substrate and the second substrate are bonded by means of bonding of the first bonding pads and the second bonding pads, at least some of the bottom electrodes are connected to the first bonding pads through piezoelectric layer vias filled with a conductive material, and the first substrate includes a heat sink groove formed between the two or more bottom electrodes with no connection with the first bonding pads in such a manner as to be filled with a thermal dissipation material.

According to the present invention, desirably, the first substrate includes air cavities formed under the bottom electrodes, and at least a portion of the heat sink groove is formed between the air cavities.

According to the present invention, desirably, the two or more bottom electrodes are connected unitarily with one another by means of an electrode connecting part, and at least a portion of the heat sink groove is formed under the electrode connecting part.

According to the present invention, desirably, at least a portion of the heat sink groove is extended outward from the electrode connecting part.

According to the present invention, desirably, the area of the heat sink groove extended outward from the electrode connecting part is larger than the area laid under the electrode connecting part.

According to the present invention, desirably, the heat sink groove has the shape of T.

According to the present invention, desirably, the head portion of the shape of T has a larger width than the other portion thereof.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE EMBODIMENTS

Figure 1:
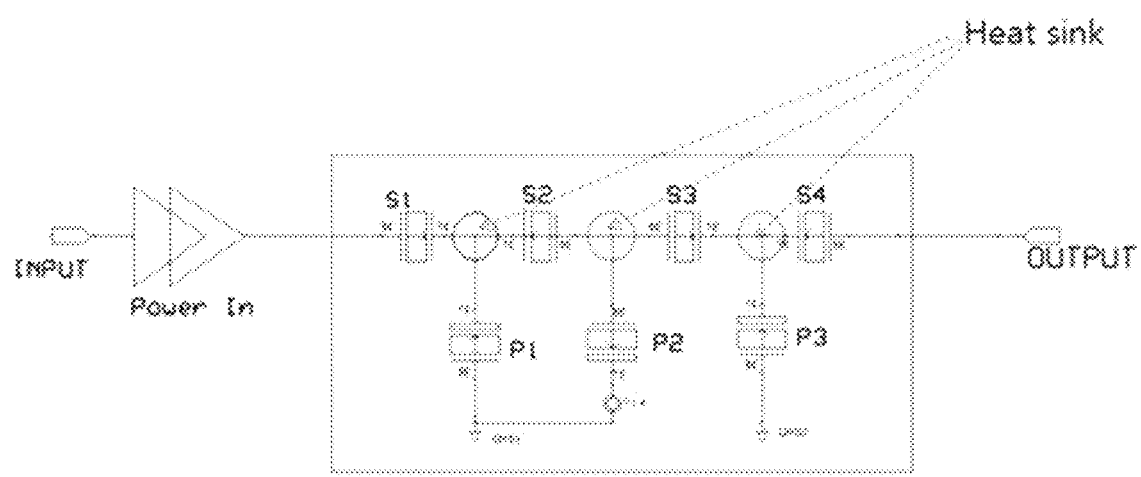
FIG. 1 is a schematic diagram showing a filter structure according to the present invention in which a plurality of FBARs are connected in series and parallel to improve power tolerance.

Now, an explanation on embodiments of the present invention will be given with reference to the attached drawings. Objects, characteristics and advantages of the present invention will be more clearly understood from the detailed description as will be described below and the attached drawings. Before the present invention is disclosed and described, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure.

In the description, when it is said that a part "includes" other elements, the part must include other components regardless of other parts, and it does not exclude addition of other components.

In the description, further, when it is said that one element is described as being "connected" to the other element, one element may be "directly connected" to the other element, but it should be understood that one element may be "indirectly" or "electrically connected" to the other element, while another element or device being present between the two elements.

In the description, when it is said that a layer (film), area, pattern or structure is located "on" or "under" a substrate, layer (film), area, pad, or pattern, it means that one member may come into contact with another member as well as yet another member may exist between the two members. Top and underside of the layer will be explained with reference to drawings.

The terms such as the first and the second may be used to only to distinguish a plurality of components, and the components should not be restricted as in orders and other characteristics.

The steps illustrated in the drawings are only sequence illustratively suggested, but other additional steps may be provided or some steps may be omitted.

FIG. 1 is a schematic diagram showing a filter structure according to the present invention in which a plurality of FBARs are connected in series and parallel to improve power tolerance.

Referring to FIG. 1, power tolerance in the FBAR filter structure according to the present invention is improved to allow heat sinks to be located between neighboring resonators, in a state where the arrangements of the resonators in the conventional FBAR filter are still maintained, to thus dissipate internal heat more easily, while not enlarging the area of the filter through the increase in the number of resonators.

According to the present invention, two types of heat sinks are provided, and they will be explained one by one.

Figure 2:
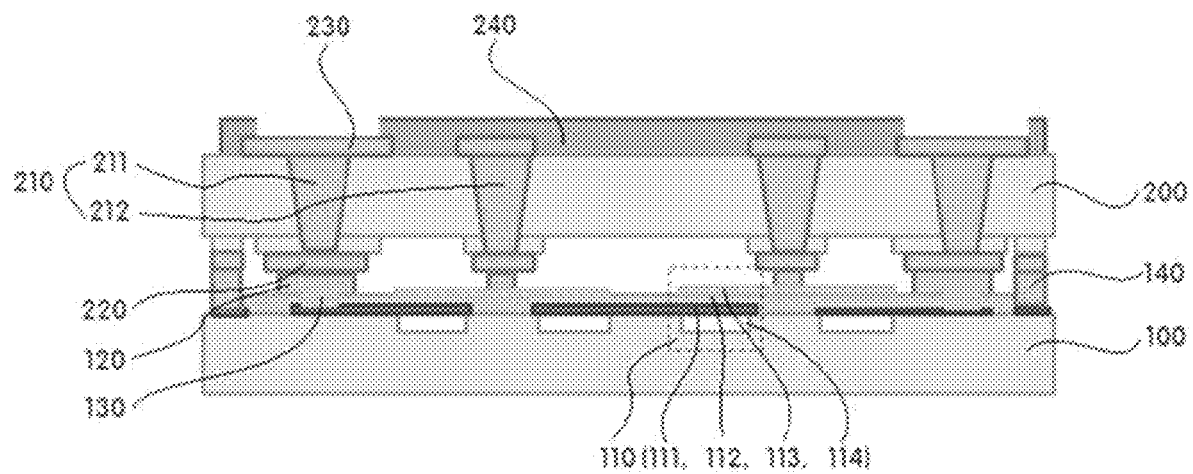
FIG. 2 is a sectional view showing an FBAR chip and package structure with improved power tolerance according to a first embodiment of the present invention, wherein via type heat sinks are formed on a second substrate.

FIG. 2 is a sectional view showing an FBAR chip and package structure with improved power tolerance according to a first embodiment of the present invention, wherein via type heat sinks are formed on a second substrate.

Referring to FIG. 2, an FBAR chip and package structure according to a first embodiment of the present invention includes a first substrate 100 and a second substrate 200. The first substrate 100 and the second substrate 200 may be silicon substrates.

A plurality of FBARs each having a bottom electrode 111, a piezoelectric material 112, and a top electrode 113 are located on the first substrate 100, and first bonding pads 120 are further located to perform WLP bonding for the first substrate 100 and the second substrate 200.

At least some of the top electrodes 113 are connected to the first bonding pads 120, and at least some of the bottom electrodes 111 are connected to the first bonding pads 120 through piezoelectric layer vias 130 filled with a conductive material.

The FBARs further include air cavities 114 formed under the bottom electrodes 111.

The second substrate 200 includes a plurality of vias 210 passing therethrough. The vias include first vias 211 connected to signal or ground wiring and second vias 212 with no connection to any signal or ground wiring.

The first vias 211 and the second vias 212 may be through silicon vias (TSVs).

Further, second bonding pads 220 are located on one end of the respective vias 210 passing through the second substrate 200 which faces the first substrate 100.

The second bonding pads 220 are bonded to the first bonding pads 120 of the first substrate 100.

Also, external connection pads 230 are located on the other end of the respective vias 210 passing through the second substrate 200 which does not face the first substrate 100 in such a manner as to be connected to the signal or ground wiring.

The external connection pads 230 may be located on all of the vias 210 or only on the first vias 211. All portions except the external connection pads 230 located on the first vias 211 are covered with a passivation layer 240, and the passivation layer 240 may be a solder resistor (SR).

Package sealing dams 140 are located on the outer package between the first substrate 100 and the second substrate 200 so as to seal the package, and they are bonded to each other by means of the first bonding pads 120 and the second bonding pads 220.

Under the above-mentioned configuration, an external RF signal is inputted to the electrodes of the FBARs through the signal wiring connected to the external connection pads 230 to generate given resonant frequency and bulk acoustic wave, and the bulk acoustic wave is transmitted to the plurality of FBARs and is thus outputted to the outside through the external connection pad 230 connected to the output side.

It can be appreciated that the FBAR filter package structure according to the first embodiment of the present invention is different from the conventional FBAR filter package structure in that the second vias 212 are additionally formed.

In specific, the FBAR filter package structure according to the first embodiment of the present invention is configured to allow the heat generated between the resonators on the first substrate 100 to be easily dissipated to the outside through the second vias 212, thereby improving the power tolerance thereof.

The second vias 212 are additionally formed, but there is no need to add any new process for forming the second vias 212.

The first vias for signal input and output are formed in the conventional practice, and when the first vias are formed, accordingly, the second vias 212 according to the present invention are formed on given positions of the package, together with the first vias.

The second vias 212 only serve to dissipate the heat and do not take part in input and output of the signal.

Figure 3:
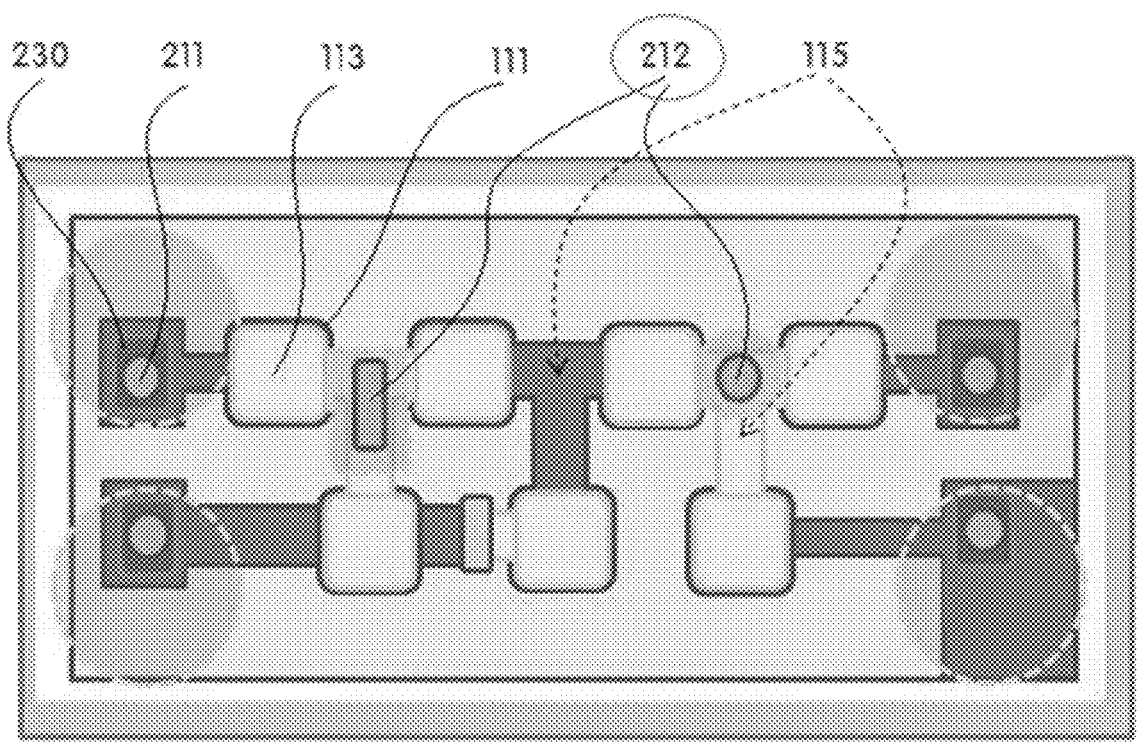
FIG. 3 is a top view showing the FBAR chip and package structure with improved power tolerance according to the first embodiment of the present invention, which is viewed on top of the second substrate.

FIG. 3 is a top view showing the FBAR chip and package structure with improved power tolerance according to the first embodiment of the present invention, which is viewed on top of the second substrate.

Referring to FIG. 3, each second via (via type heat sink) adopted in the first embodiment of the present invention is located at a center of a portion in which the top electrodes of the resonators are connected by means of an electrode connecting part 115. The electrode connecting part 115 is made of the same material as the electrodes to connect the electrodes to one another and is formed unitarily with the electrodes in a process of forming the electrodes. The electrode connecting parts 115 connect the top electrodes or bottom electrodes located on the same layer as each other to one another.

The second vias may have various shapes according to arrangements or needs of the resonators, and in FIG. 3, the second vias 212 have rectangular or circular sectional shapes.

Further, the sizes of the second vias 212 are equal to or smaller than those of the first vias 211, but if the second vias 212 have a larger diameter than the first vias 211, high heat dissipation efficiency can be obtained.

The via type heat sinks adopted in the first embodiment of the present invention are located among the plurality of FBARs, and under the configuration of FIG. 3, each via type heat sink is located among the neighboring three resonators to allow the heat generated from the three electrodes to be quickly dissipated to the outside of the package therethrough, Even if the via type heat sinks are located among the three top electrodes connected by means of the electrode connecting parts 115, as shown in FIG. 3, they may be of course located among the bottom electrodes (three bottom electrodes connected to one another on the center of FIG. 3) connected by means of the electrode connecting parts 115. In this case, the via type heat sinks may be connected to the bottom electrodes through the piezoelectric layer vias 130 of the first substrate 100.

The second vias 212 are filled with one selected from copper (Cu), molybdenum (Mo), aluminum (Al), aluminum-copper alloy (Al_Cu), gold (Au), and tungsten (W), and they may be filled with higher thermal conductivity than the first vias 211. However, the second vias 212 are filled with the same material as the filled material of the first vias 211 so as to achieve efficiency in process.

Figure 4:
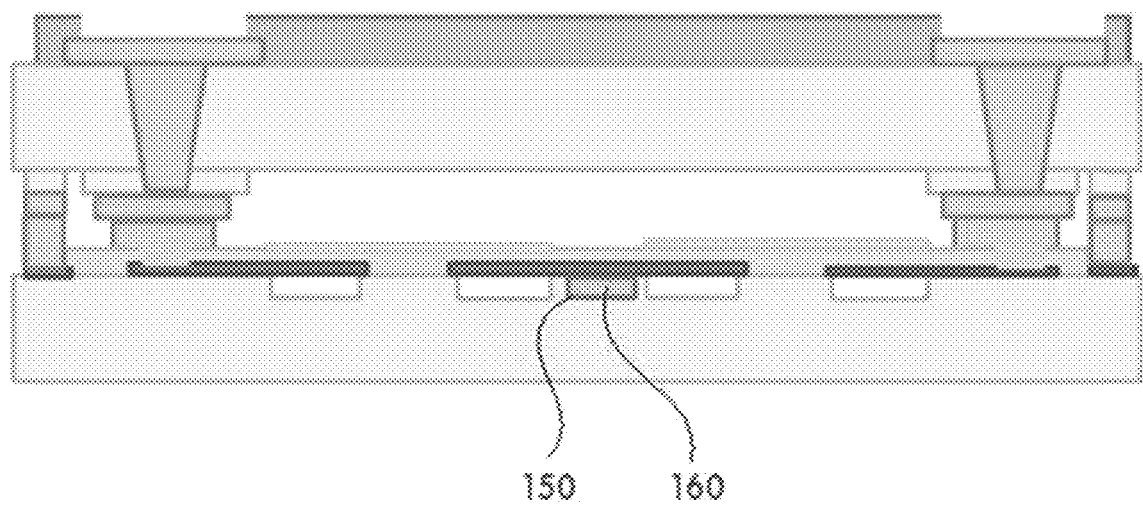
FIG. 4 is a sectional view showing an FBAR chip and package structure with improved power tolerance according to a second embodiment of the present invention, wherein an air cavity type heat sink is formed on a first substrate.

FIG. 4 is a sectional view showing an FBAR chip and package structure with improved power tolerance according to a second embodiment of the present invention, wherein an air cavity type heat sink is formed on a first substrate.

Referring to FIG. 4, a heat sink adopted in the second embodiment of the present invention is configured to have an air cavity type heat sink groove 150 filled with a thermal dissipation material 160.

The heat sink groove 150 is additionally formed between a plurality of air cavities 114 when the air cavities are formed under the bottom electrodes in the process of forming the FBARs.

Accordingly, since the heat sink groove 150 is formed together with the air cavities 114, there is no need to add a separate process of forming the heat sink groove 150, so that even in the FBAR package with a new chip structure, no inefficiency in process occurs.

The heat sink groove 150 is filled with the thermal dissipation material 160 with high thermal conductivity, thereby improving the thermal dissipation performance.

The thermal dissipation material 160 filled in the heat sink groove 150 is one selected from copper (Cu), molybdenum (Mo), aluminum (Al), aluminum-copper alloy (Al_Cu), gold (Au), and tungsten (W), and the heat sink groove 150 may be filled with higher thermal conductivity than the bottom electrode. However, the heat sink groove 150 is filled with the same material as the bottom electrode so as to achieve efficiency in process.

Figure 5:
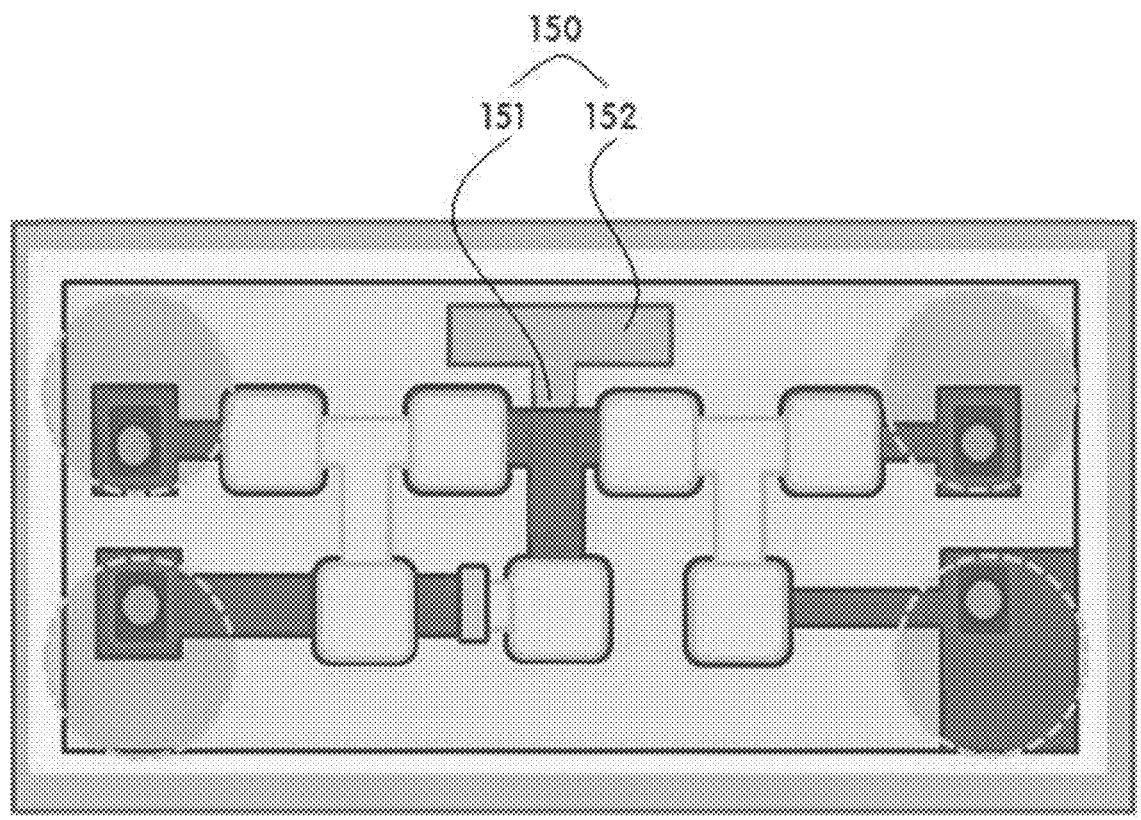
FIG. 5 is a top view showing the FBAR chip and package structure with improved power tolerance according to the second embodiment of the present invention, which is viewed on top of the second substrate.

FIG. 5 is a top view showing the FBAR chip and package structure with improved power tolerance according to the second embodiment of the present invention, which is viewed on top of the second substrate.

Referring to FIG. 5, the T-shaped heat sink groove 150 filled with the thermal dissipation material is formed under an electrode connecting part through which the neighboring three bottom electrodes of the first substrate are connected unitarily with one another.

The heat sink groove 150 includes a first area 151 that is a lower portion of the T-shaped area thereof in such a manner as to be partially laid on the electrode connecting part for the three bottom electrodes and a second area 152 that is a head portion of the T-shaped area thereof.

A portion of the heat sink groove 150 is laid on the electrode connecting part, and the other portion is extended outward from the electrode connecting part in such a manner as to be larger than the portion laid on the electrode connecting part.

The size or shape of the heat sink groove 150 may be freely formed according to the arrangements of the resonators or the allowable size of the package, and if the second area 152 as the head portion of the T-shaped heat sink groove 150 has a larger width than the first area thereof, as shown in FIG. 5, the thermal dissipation efficiency can be more improved.

Further, the heat sink groove 150 has the shape of T, as shown in FIG. 5, but of course, it may have the shape of ']' or '[' (which is half of T) made by removing one of the head portion of the shape of T.

On the other hand, the air cavity type heat sink adopted in the second embodiment of the present invention is formed together with the via type heat sinks adopted in the first embodiment of the present invention, thereby providing combined heat sinks.

Figure 6:
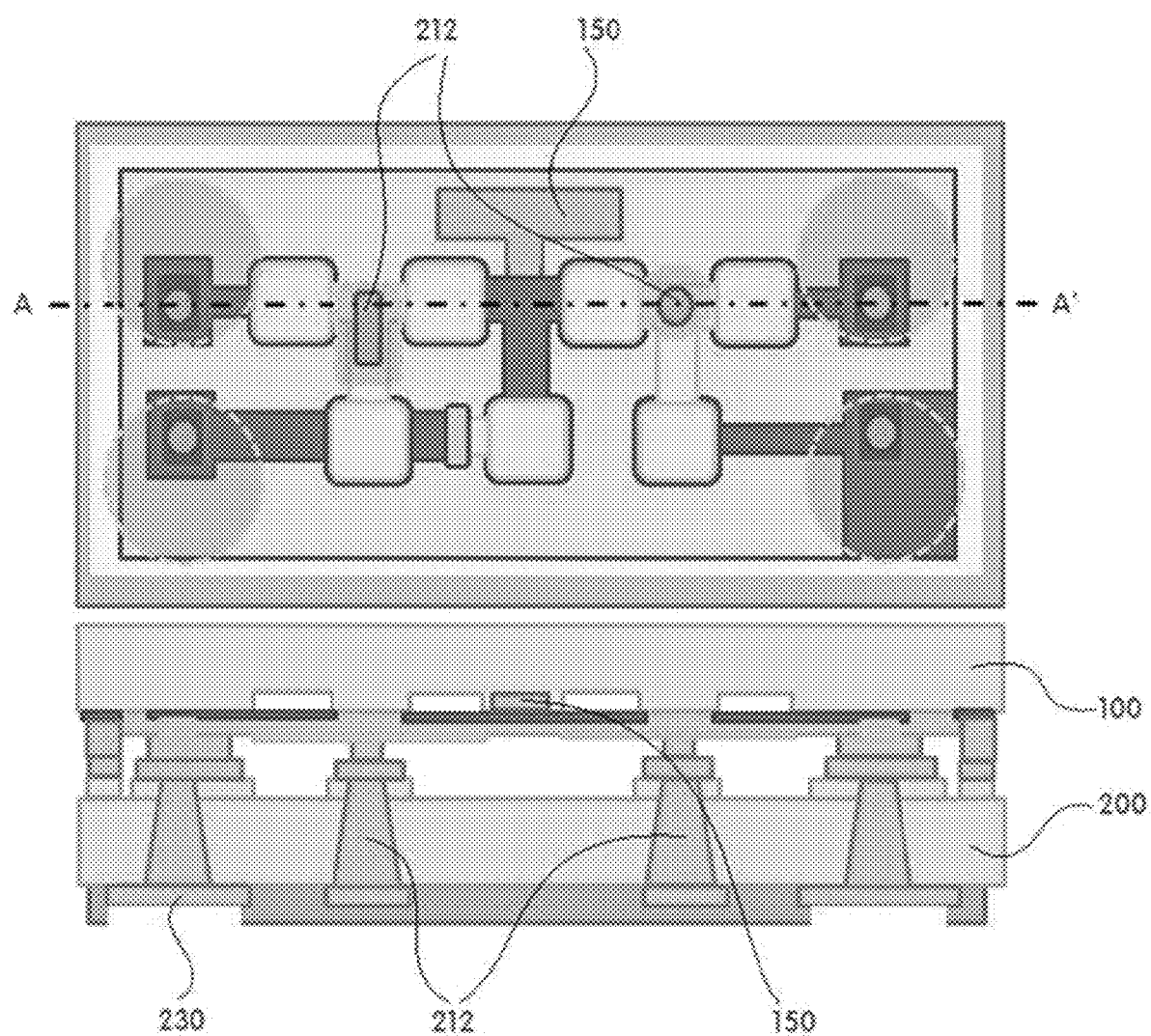
FIG. 6 is top and sectional views showing a structure including both of the first and second embodiments of the present invention and taken along the line A-A', respectively.

FIG. 6 is top and sectional views showing a package structure including both of the first and second embodiments of the present invention and taken along the line A-A' of the top view.

FIG. 6 shows the sectional view in which the positions of the first substrate 100 and the second substrate 200 are changed up and down like in the case where the FBAR package is really mounted on a main substrate.

Figure 7:
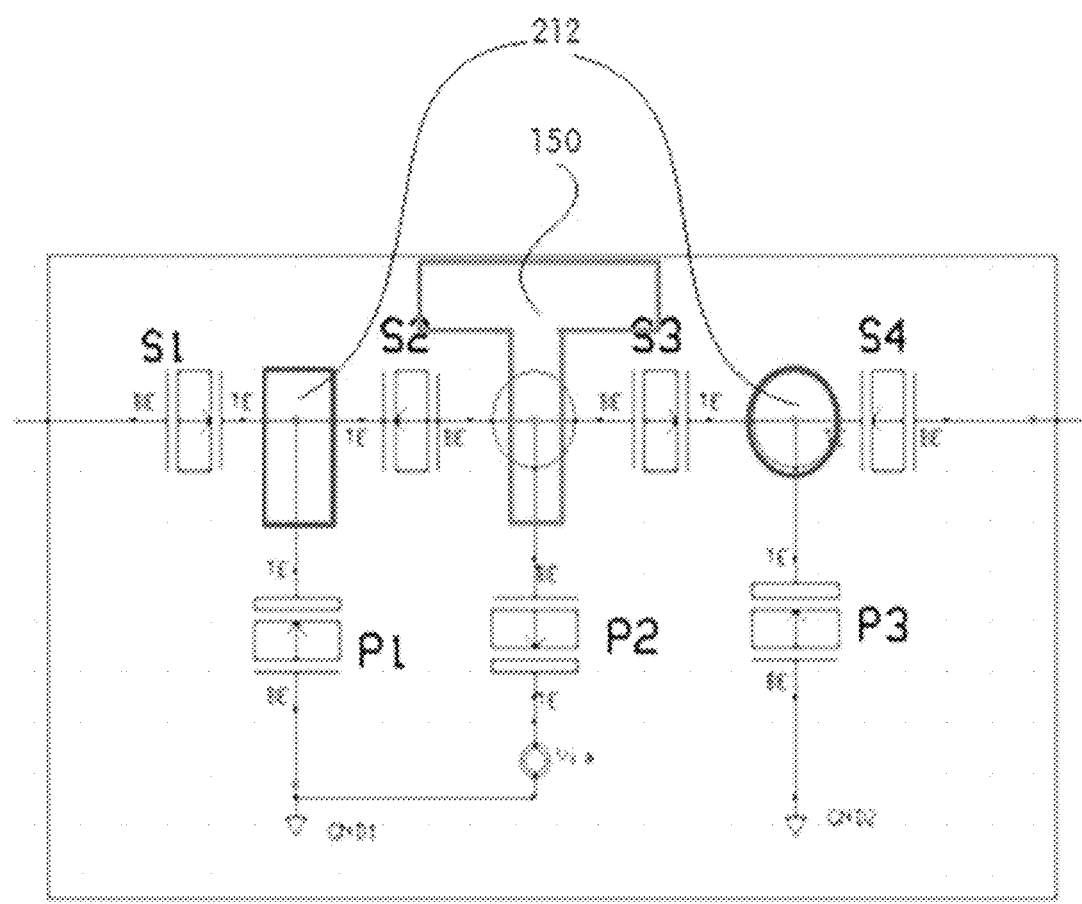
FIG. 7 is a schematic diagram showing the package of FIG. 6.
Figure 8:
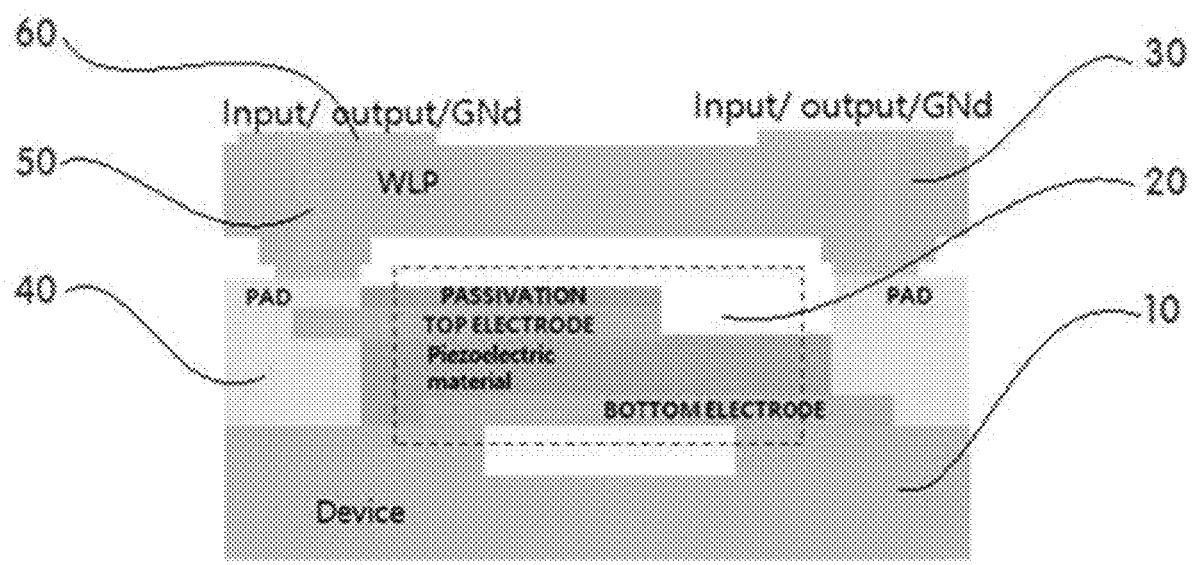
FIG. 8 is a sectional view showing a conventional FBAR package.
Figure 9:
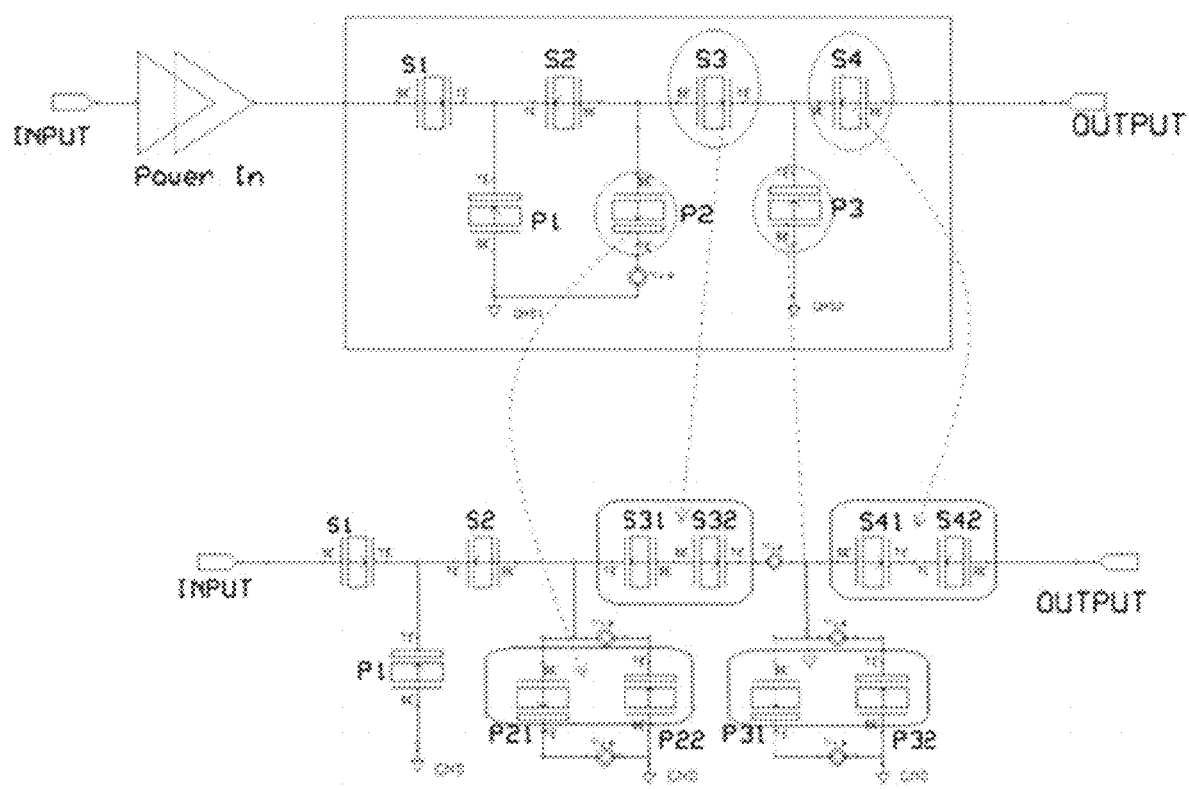
FIG. 9 is a schematic diagram showing a conventional filter structure for improving power tolerance.

FIG. 7 is a schematic diagram showing the package of FIG. 6.

As shown in FIGS. 6 and 7, of course, the package structure including the two kinds of heat sinks according to the first and second embodiments of the present invention can have better thermal dissipation performance than the package structure only with one kind of heat sink.

As described above, the FBAR chip and package structure according to the present invention can have more improved power tolerance than the conventional FBAR chip and package structure.

In addition, the FBAR chip and package structure according to the present invention can satisfy both of improved power tolerance and package miniaturization.

Further, the FBAR chip and package structure according to the present invention can efficiently utilize the existing FBAR chip structure in a manufacturing process.

Furthermore, the FBAR chip and package structure according to the present invention can still utilize the existing FBAR manufacturing procedure and equipment in a manufacturing process.

Accordingly, the FBAR chip and package structure according to the present invention can form the heat sinks with various shapes through the existing process, while not increasing the number of FBARs like the conventional practice, thereby improving the power tolerance.

The preferred embodiments of the present invention have been disclosed in the specification and drawings. In the description of the present invention, special terms are used not to limit the present invention and the scope of the present invention as defined in claims, but just to explain the present invention.

Thus, although the invention has been described with respect to specific embodiments, it will be appreciated that the invention is intended to cover all modifications and equivalents within the scope of the following claims.

What is claimed is:

1. A film bulk acoustic resonator (FBAR) chip and package structure with improved power tolerance, comprising:
   a first substrate having:
      a plurality of FBARs each having a bottom electrode, a piezoelectric material, and a top electrode, and
      first bonding pads connected to the bottom electrodes or the top electrodes of the plurality of FBARs; and
   a second substrate having:
      a plurality of vias passing therethrough,
      second bonding pads located on one end surface of the plurality of vias facing the first substrate, and
      external connection pads located on another end surface of the plurality of vias which does not face the first substrate,
   wherein the first substrate and the second substrate are bonded by means of bonding of the first bonding pads and the second bonding pads to each other,
   at least some of the bottom electrodes are connected to the first bonding pads through piezoelectric layer vias filled with a conductive material, and
   the plurality of vias on the second substrate comprise first vias connected to signal or ground wiring through the external connection pads, and second vias with no connection to any signal or ground wiring, and
   wherein the first substrate comprises air cavities therein which are formed under a portion of the bottom electrodes stacked under the piezoelectric material and the top electrode of each FBAR, and at least a portion of the heat sink groove is formed between the air cavities, the heat sink groove being filled with a thermal dissipation material.

2. The FBAR chip and package structure according to claim 1, wherein the first vias are filled with a conductive material, and the second vias are filled with a material having a higher thermal conductivity than the first vias.

3. The FBAR chip and package structure according to claim 2, wherein the first vias and the second vias are filled with the same material.

4. The FBAR chip and package structure according to claim 2, wherein the first vias and the second vias are filled with different materials from each other.

5. The FBAR chip and package structure according to claim 1, wherein the first vias are connected to the piezoelectric layer vias.

6. The FBAR chip and package structure according to claim 1, wherein diameters of the first vias and the second vias are different from each other.

7. The FBAR chip and package structure according to claim 6, wherein the diameters of the second vias are larger than the diameters of the first vias.

8. The FBAR chip and package structure according to claim 1, wherein sectional shapes of the first vias and the second vias are different from each other.

9. The FBAR chip and package structure according to claim 1, wherein the first vias and the second vias are through silicon vias (TSVs).

10. The FBAR chip and package structure according to claim 1, wherein the external connection pads are formed on the first vias.

11. The FBAR chip and package structure according to claim 1, wherein if the external connection pads are formed on the second vias, the external connection pads are covered with passivation layers.

12. The FBAR chip and package structure according to claim 1, wherein at least two or more top or bottom electrodes of the plurality of FBARs are connected unitarily with one another by means of electrode connecting parts, and when viewed on top, the second vias are formed among the at least two or more top or bottom electrodes connected unitarily with one another.

13. A film bulk acoustic resonator (FBAR) chip and package structure with improved power tolerance, comprising:
   a first substrate having:
      a plurality of FBARs each having a bottom electrode, a piezoelectric material, and a top electrode, and
      first bonding pads connected to the bottom electrodes or the top electrodes of the plurality of FBARs; and
   a second substrate having:
      a plurality of vias passing therethrough,
      second bonding pads located on one end surface of the plurality of vias facing the first substrate, and
      external connection pads located on another end surface of the plurality of vias which does not face the first substrate,
   wherein the first substrate and the second substrate are bonded by means of bonding of the first bonding pads and the second bonding pads to each other,
   at least some of the bottom electrodes are connected to the first bonding pads through piezoelectric layer vias filled with a conductive material, and
   the first substrate comprises a heat sink groove formed between two or more of the bottom electrodes with no connection with the first bonding pads, the heat sink groove being filled with a thermal dissipation material, and
   wherein the first substrate comprises air cavities formed under a portion of the bottom electrodes stacked under the piezoelectric material and the top electrode of each FBAR, and at least a portion of the heat sink groove is formed between the air cavities.

14. The FBAR chip and package structure according to claim 13, wherein the two or more bottom electrodes are connected unitarily with one another by means of an electrode connecting part, and at least a portion of the heat sink groove is formed under the electrode connecting part.

15. The FBAR chip and package structure according to claim 14, wherein at least a portion of the heat sink groove is extended outward from the electrode connecting part.

16. The FBAR chip and package structure according to claim 15, wherein an area of the heat sink groove extended outward from the electrode connecting part is larger than an area laid under the electrode connecting part.

17. The FBAR chip and package structure according to claim 15, wherein the heat sink groove has a shape of T or a shape of ']' or '[' (which is half of T) made by removing one of a head portion of the shape of T.

18. The FBAR chip and package structure according to claim 17, wherein the head portion of the shape of T or the shape of half of T has a larger width than another portion thereof.

* * * * *